United States Patent
Weihs et al.

(10) Patent No.: US 6,171,467 B1
(45) Date of Patent: Jan. 9, 2001

(54) ELECTROCHEMICAL-CONTROL OF ABRASIVE POLISHING AND MACHINING RATES

(75) Inventors: Timothy P. Weihs; Adrian B. Mann; Peter C. Searson, all of Baltimore, MD (US)

(73) Assignee: The John Hopkins University, Baltimore, MD (US)

(*) Notice: Under 35 U.S.C. 154(b), the term of this patent shall be extended for 0 days.

(21) Appl. No.: 09/198,483

(22) Filed: Nov. 24, 1998

Related U.S. Application Data

(60) Provisional application No. 60/066,307, filed on Nov. 25, 1997.

(51) Int. Cl.[7] .................................................. H01L 21/302
(52) U.S. Cl. .................. 205/93; 156/345; 204/224 R; 204/224 M; 205/123; 205/662; 205/663; 216/38; 216/89; 438/692; 438/693; 451/287
(58) Field of Search .................... 204/224 M, 224 R; 205/662, 663, 93, 123; 156/345 LP; 216/38, 88, 89; 438/692, 693; 451/285, 286, 287, 288

(56) References Cited

U.S. PATENT DOCUMENTS

| | | | |
|---|---|---|---|
| 4,839,005 | * | 6/1989 | Katsumoto et al. ............ 204/129.46 |
| 4,956,056 | * | 9/1990 | Zubatova et al. ............... 204/129.43 |
| 5,562,529 | | 10/1996 | Kishii et al. ............................ 451/36 |
| 5,575,706 | * | 11/1996 | Tsai et al. ............................... 451/41 |
| 5,637,031 | | 6/1997 | Chen ....................................... 451/41 |
| 5,637,185 | | 6/1997 | Murake et al. ........................... 438/5 |
| 5,639,363 | * | 6/1997 | Ohmori et al. ....................... 205/652 |

OTHER PUBLICATIONS

F. A. Lowerheim, *Electroplating*, McGraw–Hill book Co., New York, pp. 137–139, 1978.*
*Surface Layer Formation During the Chemical Mechanical Polishing of Copper Thin Films*, J.M. Steigerwald et al., 337 MRS Symp. Proc., 133–138 (1994).
*Mechanisms of Copper Removal During Chemical Mechanical Polishing*, J.M. Steigerwald, J. Vac. Sci. Tech. B 13, 2215–2218 (1995).
*Effect of Copper Ions in the Slurry on the Chemical–Mechanical Polish Rate of Titanium*, J.M. Steigerwald et al., 141 J. Electrochem. Soc., 3512–3516 (1994).
*the Effect of the Polishing Pad Treatments on the Chemical–Mechanical Polishing of SiO$_2$ Films*, W. Li, D.W. Shin et al., 270 Thin Solid Films, 601–606 (1995).

* cited by examiner

Primary Examiner—Kathryn Gorgos
Assistant Examiner—William T. Leader
(74) Attorney, Agent, or Firm—Dickstein Shapiro Morin & Oshinsky LLP

(57) ABSTRACT

An apparatus and method is disclosed; both of which use electrochemistry to selectively grow and remove hard oxide coatings on metals, and capacitive double layers on non-metals and semiconductors in order to predict and control the rate of surface abrasion during planarization of the surface of such materials.

6 Claims, 5 Drawing Sheets

ELECTROCHEMICAL-CONTROL OF ABRASIVE POLISHING AND MACHINING RATES

This application derives and claims priority from provisional U.S. patent application Ser. No. 60/066,307, filed Nov. 25, 1997, which is incorporated herein by reference.

Government Interest: This invention was made with government support under Grant No. NSF MRSEC DMR 9632526 awarded by the National Science Foundation. The government has certain rights in the invention.

BACKGROUND OF THE INVENTION

In the process of semiconductor fabrication, layers of material are deposited onto substrate surfaces to form interconnects. Excess layer material is removed so that a further level of interconnects may be placed on top of the material. In this way, many layers can be created. In such structures, however, the topography of each layer must be precisely controlled so that successive layers and photolithographic processes can be accurately applied.

A process known as planarization is performed on the surface of each layer to prepare the surface of each layer for subsequent levels. Currently, surface planarization is achieved using mechanical polishing, mechanical machining, and chemo-mechanical polishing (CMP).

Mechanical polishing, for example, utilizes an abrasive material, typically in the form of a pad or slurry, which is moved repetitively over the surface to be polished. This causes small particles of the surface to be removed from the highest surface features while the lower features remain relatively untouched. In this way, a high degree of planarization is achieved.

Mechanical machining, on the other hand, involves the selective removal of material from specific sites by the application of a hard, abrasive machining piece, as used for instance in a lathe.

Both mechanical machining and mechanical polishing involve the mechanical breaking of bonds between the material being abraded and the surface itself. At present, the success of each of these methods is limited since there is no way of controlling the hardness of the surface being planarized. Rather, planarization is currently achieved by controlling the abrasive qualities of the polishing pad or slurry. This allows for only an indirect control of the planarization. As an example, Murarka et al. (U.S. Pat. No. 5,637,185) teaches measuring the electrical potential of the slurry in order to detect the end of the polishing process. Similarly, Tsal et al. (U.S. Pat. No. 5,575,706) teaches the utilization of electric fields to control the density of the abrasive slurry particles between the polishing pad and the Si-wafer. In addition, Kishii et al. (U.S. Pat. No. 5,562,529) teaches the use of electrochemistry to increase the density of ions in the slurry.

In yet another method of effecting planarization, chemo-mechanical polishing (CMP) uses chemical means to break chemical bonds at the surface during polishing or machining of a surface. Similar to the mechanical methods, CMP is currently limited since there is presently no way of controlling the hardness of the surface being planarized. Rather, CMP processes rely upon measuring the rate of surface layer formation, dissolution rates, and rate of chemical acceleration of polish rates in order to control surface planarization. *Surface Layer Formation During The Chemical Mechanical Polishing of Copper Thin Films*, J. M. Steigerwald et al., MRS Symp. Proc. 337, 133, 1994; *Mechanisms of Copper Removal During Chemical Mechanical Polishing*, J. M Steigerwald, J. Vac. Sci. Tech. B 13, 2215, 1995. In addition, other chemical techniques, as taught by Chen, (U.S. Pat. No. 5,637,031) control slurry density and wear rates using the addition of ions from a variety of elements. *Effect of Copper Ions in The Slurry on The Chemical-Mechanical Polish Rate of Titanium*, J. M Steigerwald et al., *J. Electrochem. Soc.* 141, 3512, 1994; *The Effect of The Polishing Pad Treatments on The Chemical-Mechanical Polishing of SiO$_2$ Films*, W. Li, D. W. Shin et al., *Thin Solid Films* 270, 601, 1995; *Electrochemical Potential Measurements During The Chemical-Mechanical Polishing of Copper Thin Films*, J. M. Steigerwald et al., J. Electrochem. Soc. 142, 2379, 1995.

Each of these CMP methods are limited in controlling planarization as they do not allow for the direct control of the surface wear properties of a surface being planarized.

SUMMARY OF THE INVENTION

It is an object of the invention to provide the ability to control or inhibit wear on the surface of a material such as a semiconductor.

Another object of the invention is to control the surface conditions of a material such as a semiconductor using electrochemistry.

Yet another object of the invention is to control the wear rate of the semiconductor material using electrochemistry.

The present invention accomplishes the above and other objects and advantages by providing a method of and apparatus for using electrochemistry to selectively grow or remove oxide coatings on metals or to create a capacitive double layer on non-metals in order to directly control the surface wear properties of a surface being planarized.

For many materials, the application of an electric potential to the surface when it is immersed in an electrolyte permits the controlled growth of a surface layer.

According to the present invention, the chemical and physical properties of a surface (e.g., hardness of a surface, oxide composition, etc.) and its rate of abrasive wear are directly linked so that the electrochemical growth of the oxide layer and the creation of a double capacitive layer provides a means to control the wear rate of the surface.

BRIEF DESCRIPTION OF THE DRAWINGS

The foregoing and other objects and advantages of the present invention will become more apparent from the detailed description of the preferred embodiments of the present invention given below with reference to the accompanying drawings in which:

FIG. 1(*b*) shows the generation of a capacitive double layer of oxide film;

FIG. 2(*b*) shows the mechanical hardness of the metal surface with the oxide present versus the voltage at which it was grown;

DETAILED DESCRIPTION OF PREFERRED EMBODIMENTS

The present invention will be described in detail as set forth in the preferred embodiments illustrated in FIGS. 1–6. Although these embodiments depict the invention in its preferred application to specific semiconductor materials, it should be readily apparent that the invention has equal application to any type of material that encounters the same or similar problems.

Figure 1A:
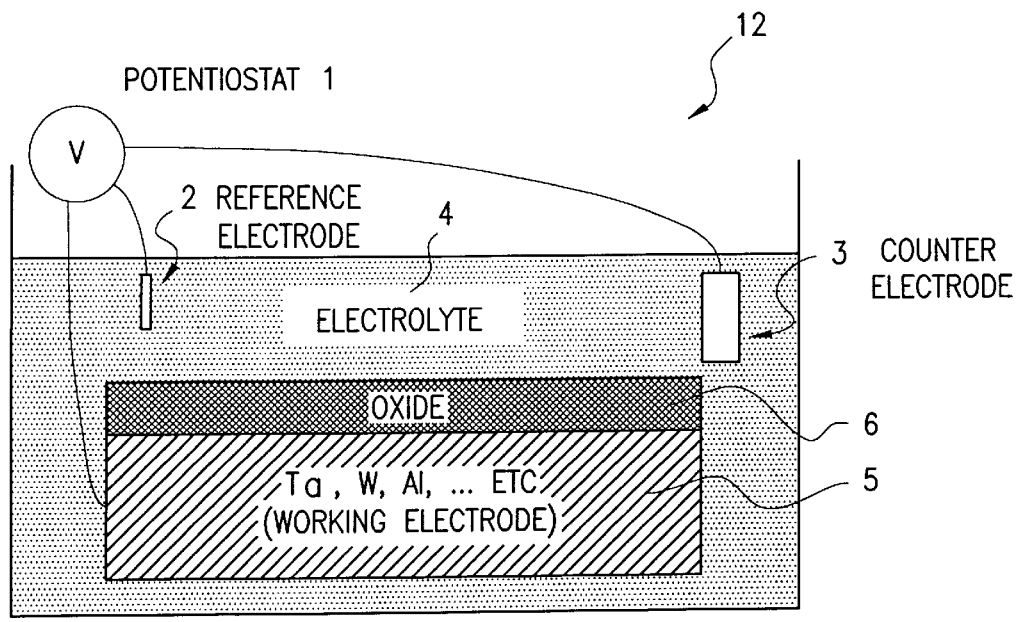
FIG. 1(*a*) shows the formation of a surface layer of oxide film on a metallic system.

FIG. 1(a) is a schematic view of an apparatus 12 for the controlled growth of an oxide layer 6. The apparatus 12 includes a potentiostat 1 (or other power supply) for applying an electrical potential to the surface of the sample 5. The potentiostat 1 applies the desired voltage to the sample 5 such that the sample 5 operates as a working electrode in the standard three electrode cell model. The apparatus also employs a reference electrode 2 and a counter electrode 3, both of which are immersed in the electrolyte 4 (or other known aqueous solution or bath). The reference and counter electrodes are used to assist in measuring and maintaining the desired electrical potential on the sample 5 when it is immersed in electrolyte 4.

Figure 1B:
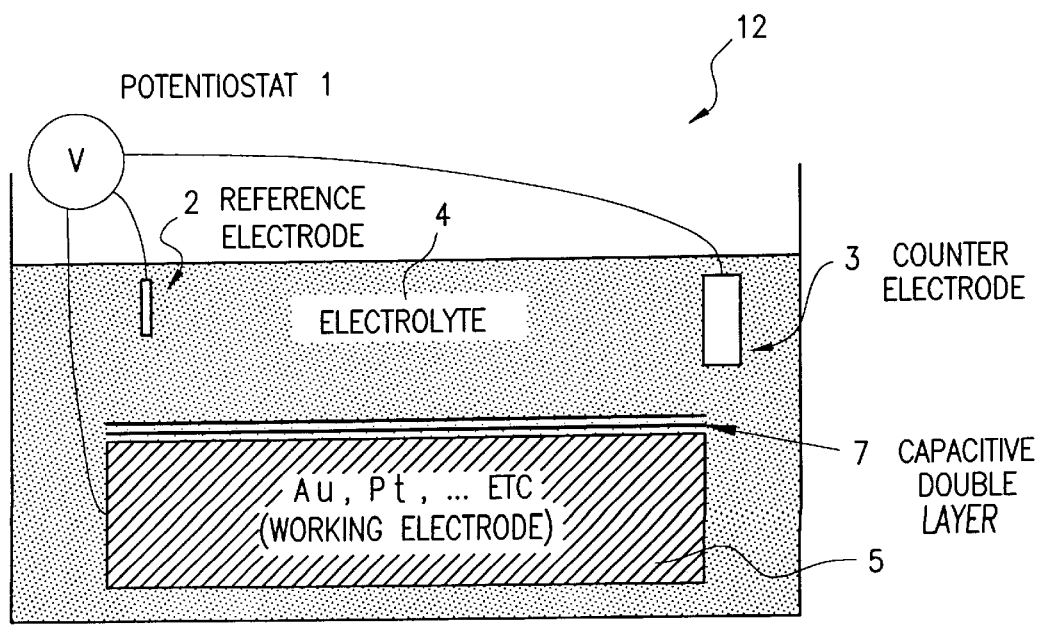

In metallic systems (e.g., Ni, W, Ta, Al, Cu, Mo, etc.) the surface layer may be an oxide film, which can be in the form of either a porous layer or a filly dense barrier layer dependent upon the composition of the electrolyte and the voltage potential applied. For other conductive materials which do not have a native oxide, as well as semiconductors (such as, for example, Si and GaAs), the application of an electric potential can lead to the generation of a capacitive double layer at the surface, and eventually, at large potentials, an oxide film will develop. The presence of a wear resistant surface layer, in the form of both oxide films and capacitive double layers, modifies the abrasive wear properties of a surface and, as a consequence, electrochemistry provides a direct means by which to control the wear rate of a surface during mechanical polishing and machining. This controlled application of voltage permits the controlled growth of the oxide layer 6, as shown in FIG. 1(a). In metallic systems (such as, for example, Ni, W, Ta, Al, Cu, Mo, etc.), the oxide layer 6 may be in the form of either a porous layer or a fully dense barrier layer dependent upon the composition of the electrolyte and the voltage potential applied. Where the sample 5 is a conductive material that has no oxide film layer or the sample is a semiconductor such as Si or GaAs, a capacitive double layer 7 is formed at the surface of the material, as shown in FIG. 1(b).

Figure 2A:
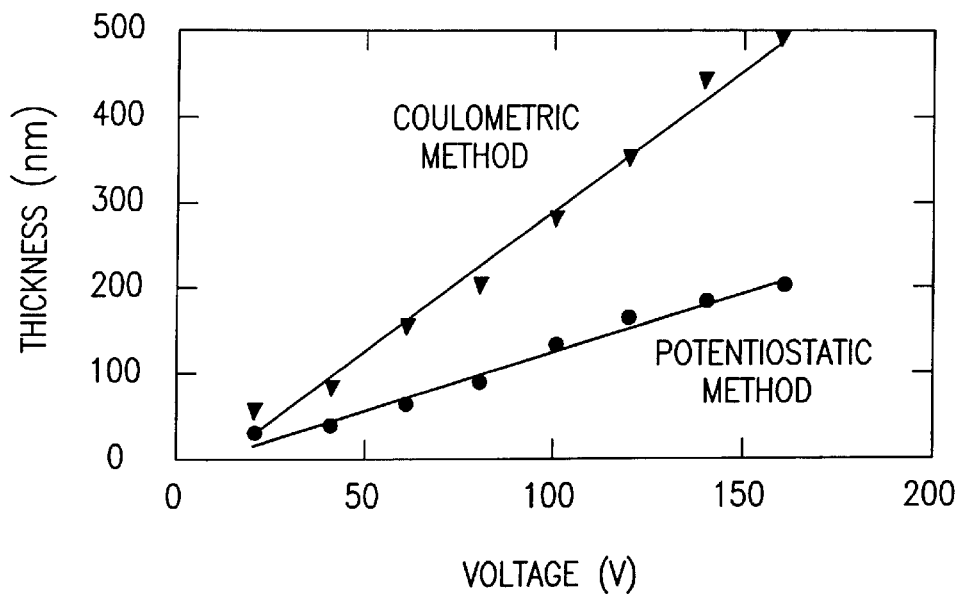
FIG. 2(*a*) shows the oxide thickness at a specified applied voltage.
Figure 2B:
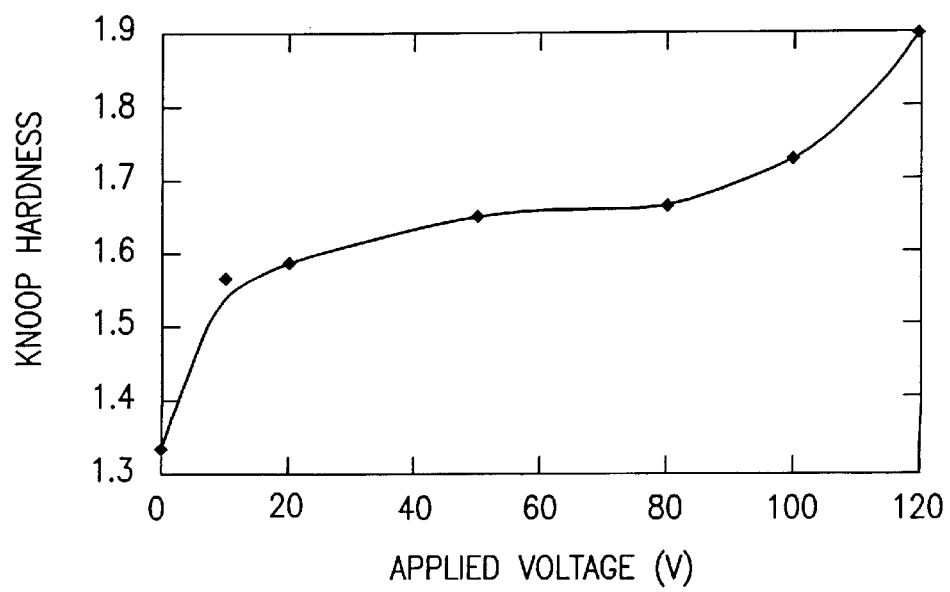

In accordance with the invention, the growth and characteristics of the oxide layer on such metals (e.g., Ta (tantalum)) is controlled. In particular, the thickness of the oxide can be increased (or decreased) with a corresponding proportional increase (or decrease) in the applied voltage, as shown in FIG. 2(a). In addition, the variation of the voltage proportionally affects the hardness of the surface, as shown in FIG. 2(b). (In FIG. 2(a), the oxide thickness at a specified voltage is measured by two different methods: coulometric and potentiostatic. The two methods give different absolute values for the thickness because they use different constants in their calculations.)

Applying the relationships illustrated in FIGS. 2a and 2b, manipulation of the voltage through the potentiostat 1 allows for the growing of oxides of a predetermined thickness and hardness. Inasmuch as the hardness of a surface and its rate of abrasive wear are directly linked, the electrochemically controlled growth of the oxide layer provides a reliable mechanism to control the wear rate of the surface.

Figure 3A:
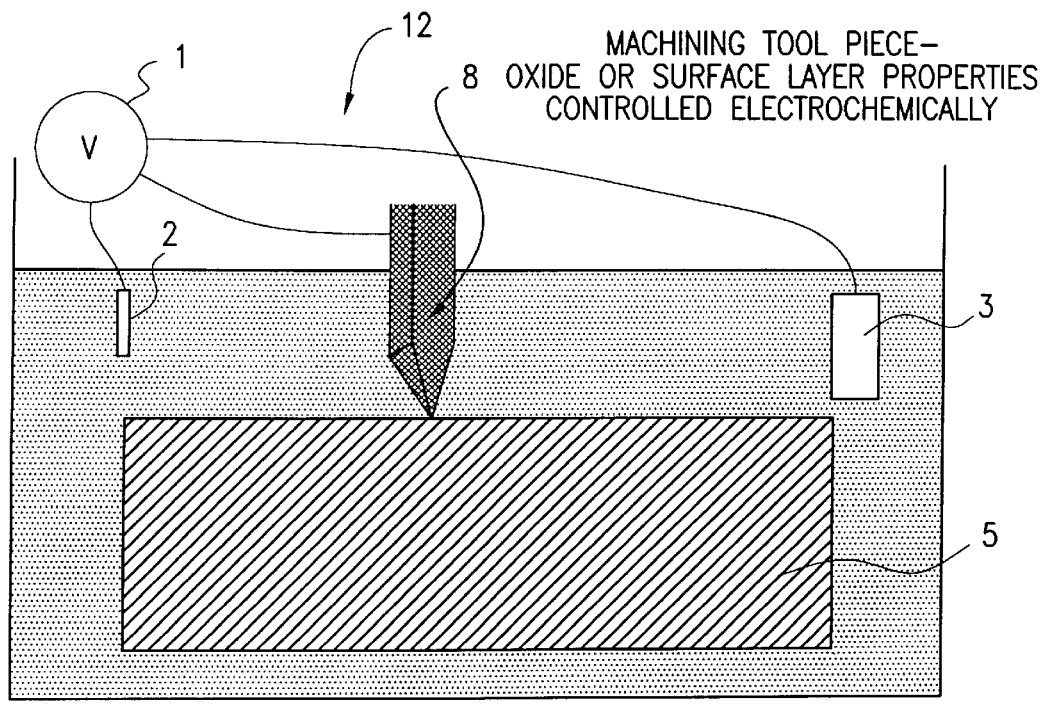
FIGS. 3(*a*) and 3(*b*) show the utilization of a conductive machine tool in accordance with the invention.

As shown in FIG. 3(a), the invention can be readily applied to mechanical machining procedures. Here a voltage is applied not to the surface of the sample 5 being machined but to the machine tool 8 itself. When using such a conductive machine tool piece 8, the cutting surface of the machine tool can be controlled to minimize the wear of the machine tool and simultaneously enhance the rate of abrasion of the surface of the sample 5 being machined.

Figure 3B:
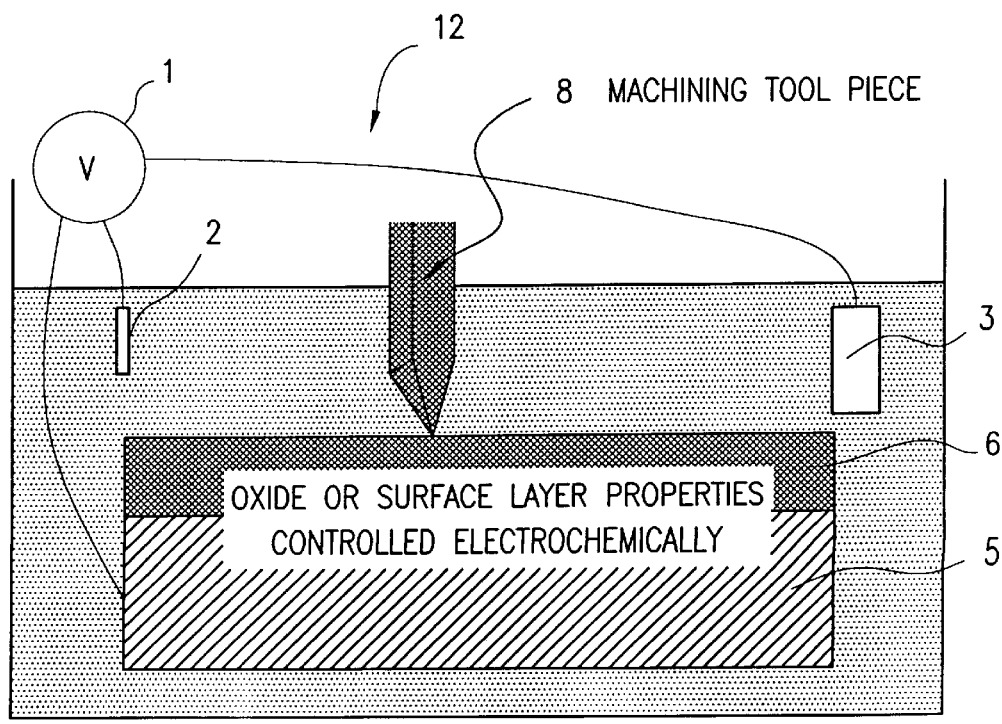

In the alternative, as shown in FIG. 3(b), where the sample 5 being machined is conductive, the invention can be used by applying the voltage across the sample 5 itself to grow an oxide or capacitive layer 6 on the sample 5.

Figure 4:
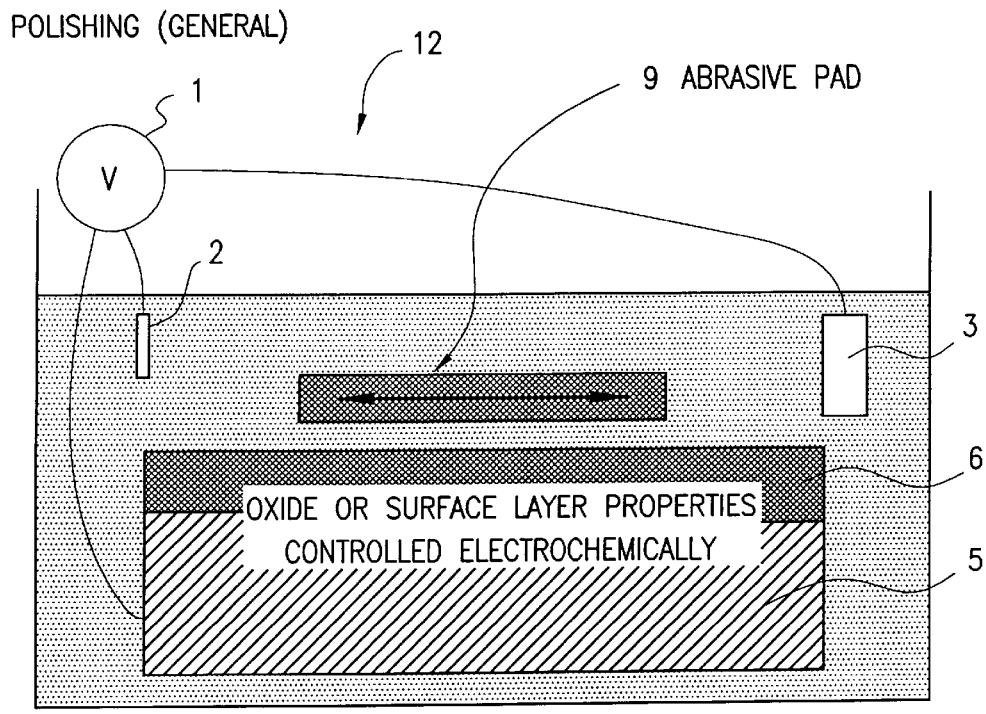
FIG. 4 shows the use of the invention with mechanical polishing.

FIG. 4 illustrates another embodiment of the present invention in which the above technique is used in the specific application of mechanical polishing. In this embodiment, an abrasive pad 9 is used in place of the machine tool piece 8 in order to less abrasively wear the substrate surface 6.

Figure 5A:
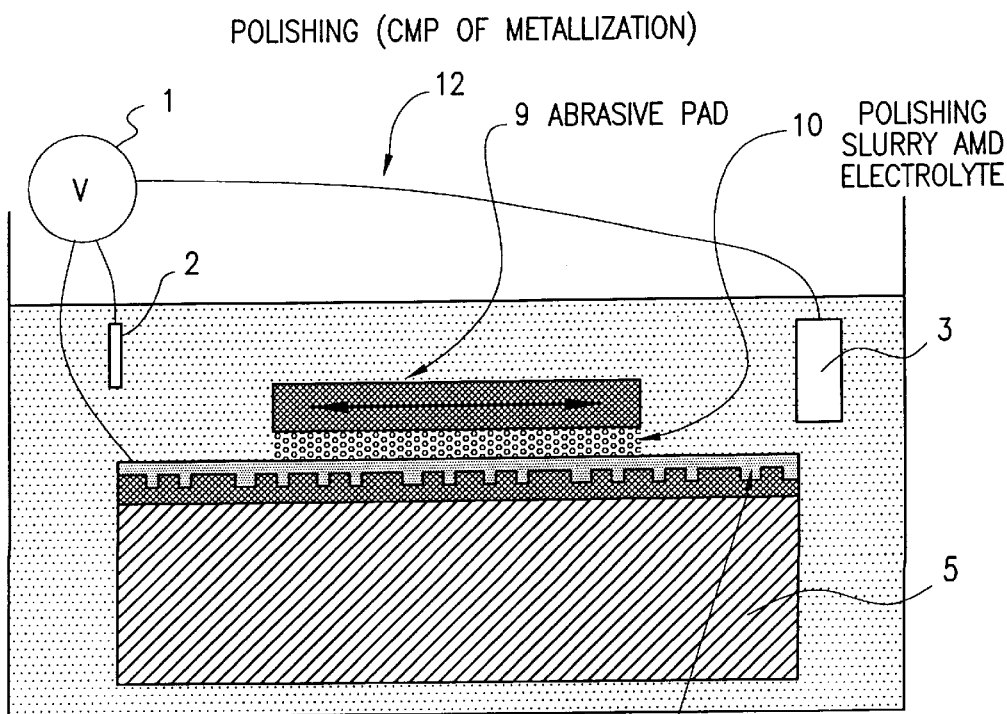
FIGS. 5(*a*) and 5(*b*) show use of the invention with chemo-mechanical polishing (CMP)

FIG. 5(a) illustrates another embodiment of the present invention in which the application of voltage to the metallization layer is used in conjunction with the chemo-mechanical polishing (CMP) of metallization. In this embodiment, a polishing slurry and electrolyte 10 are used to abrasively wear the surface of metallization layer 11, which has been added to substrate 5. A voltage is applied to metallization layer 11 in order to control the oxide or surface layer properties during the CMP process and in accordance with the invention.

Figure 5B:
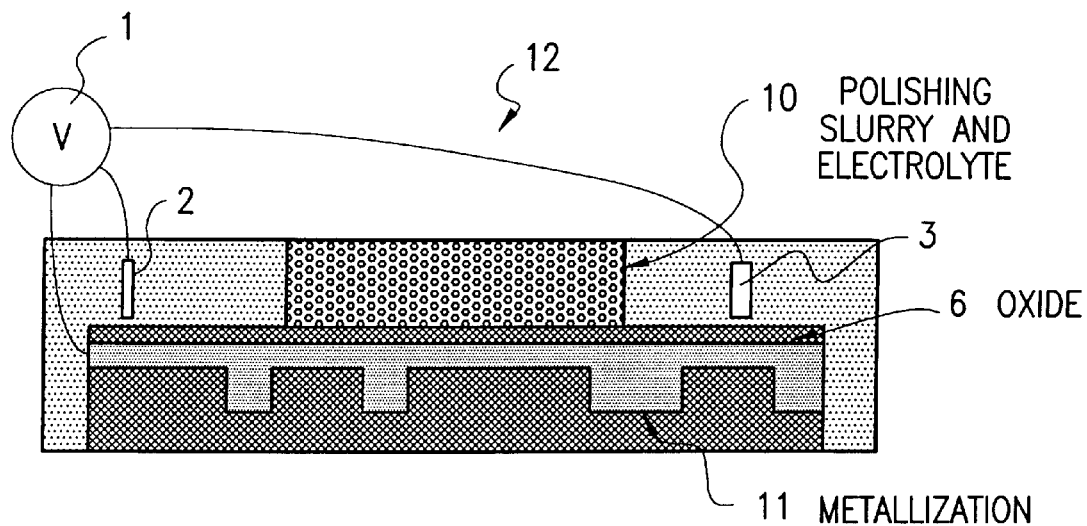

As shown in FIG. 5(b), by making the metallization layer 11 the working electrode of a standard three-electrode cell, in accordance with the invention, a barrier surface oxide layer 6 can be grown on metallization layer 11. This lowers the rate of abrasive wear at the metal's surface. Thus, using the invention in conjunction with a CMP process, for instance, in the fabrication of an integrated circuit upon a Silicon wafer, the oxide 6 can be selectively grown and removed during the polishing process to either decrease or increase the rate of polishing.

Figure 6:
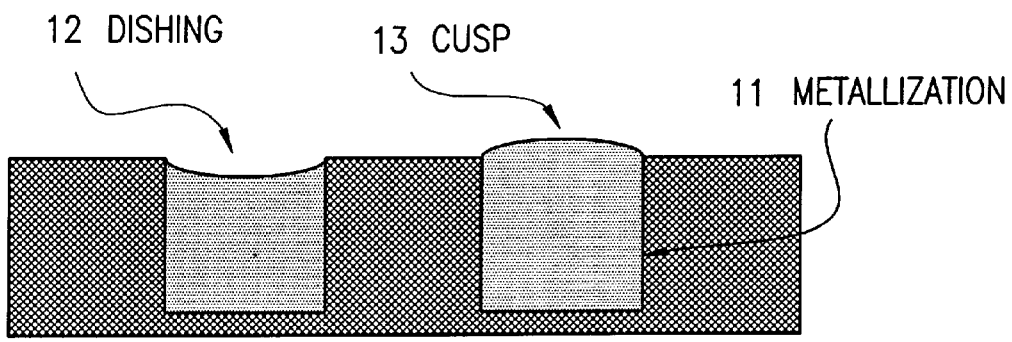
FIG. 6 shows the occurrence of dishing and cusp formation in metallization.

As an example, during the initial stage of the polishing, the oxide 6 could be removed to increase the speed of the polishing process, but then re-grown when the metallization layer 11 is very thin, so as to ensure that the final stages of the polishing process produce a highly planar surface. Having the wear resistant oxide layer 6 present during the final stages of the polishing process will improve the local planarization (i.e., the surface is level over very small areas (on the order of micrometers)) as the metal interconnects will be less likely to suffer from the dishing 12 or cusp 13 formation problems as shown in FIG. 6.

It is important to realize that the processes described throughout this disclosure are simply a few examples and preferred embodiments describing how electrochemistry can be used to engineer a surface with specific wear properties. During many other processes involving planarization, the same basic technique can be used to control abrasive wear.

Additionally, it should be stated that the technique is not restricted to metallic systems with a native oxide layer and, as stated previously, it can be utilized with metallic systems where there is no native oxide, and also with non-metallic conductors, such as semiconductors and high-temperature superconductors. For metals which do not have a native oxide, electrochemistry can be used to artificially create an oxide layer. For both non-metals and metals, electrochemistry provides a way to vary the size of the capacitive double layer which develops at the surface. Modifying the double layer permits the adhesive force between two contacting surfaces to be varied and so provides a way to reduce or increase the force applied at an abrasive contact. This in turn permits the rate of wear of a surface to be controlled.

Although the invention has been described in terms of the particular apparatus embodying the invention, the method steps required to make and use the apparatus are readily apparent to those of ordinary skill in the art merely from the description of the apparatus itself.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but are commensurate with the spirit and scope of the invention. For example, instead of the standard three-electrode cell used to control growth of oxides or capacitive layers, a two-electrode cell or equivalent construction may similarity be used to obtain the same effects described herein.

What is claimed is:

1. A method of treating a surface of material on a silicon wafer, the method comprising the steps of:

placing the silicon wafer in an electrolytic bath;

placing reference and counter electrodes in the electrolytic bath;

connecting a working electrode to the material on the silicon wafer to be planarized;

applying a voltage to the working electrode so as to control growth and removal of a wear surface layer formed on the material; and planarizing the material and the wear surface layer formed on the material.

2. The method as recited in claim 1, wherein the wear surface layer is in the form of an oxide and wherein said step of applying a voltage includes the substep of increasing the voltage relative to the reference electrode so as to increase thickness of the oxide formed on the material.

3. The method as recited in claim 2, wherein said step of applying a voltage includes the substep of decreasing the voltage relative to the reference electrode so as to decrease hardness of the oxide formed on the material.

4. The method as recited in claim 1, wherein said step of planarizing the material includes the substep of chemo-mechanically polishing the material and the wear surface layer formed on the material so as to prepare a substantially planar surface.

5. A system for using chemo-mechanical polishing (CMP) to planarize a surface of a metal interconnect applied during fabrication of an integrated circuit upon a silicon wafer, the system comprising:

an electrolytic bath, wherein the silicon wafer is immersed in said electrolytic bath during CMP;

an abrasive pad, wherein said abrasive pad applies a mechanical force on the surface of the metal interconnect while immersed in the electrolytic bath during CMP;

a polishing slurry, said polishing slurry being immersed in the electrolytic bath, and being applied to a surface of the metal interconnect; and a power source applying a controlled voltage to said electrolytic bath during CMP, said power source further comprising:

a working electrode coupled to the surface of the metal interconnect;

a reference electrode, said reference electrode being immersed in the electrolytic bath; and a counter electrode, said counter electrode being immersed in the electrolytic bath;

wherein the controlled voltage is applied across said working and reference electrodes as increased and decreased voltages to respectively facilitate growth and removal of a polishing surface layer formed on the surface of the metal interconnect during CMP.

6. The system as recited in claim 5, wherein the polishing surface layer comprises a layer of oxide formed between the surface of the metal interconnect and the polishing slurry during CMP.

* * * * *